US012602885B2

(12) United States Patent
Funakoshi

(10) Patent No.: US 12,602,885 B2
(45) Date of Patent: Apr. 14, 2026

(54) SIGNAL PROCESSING APPARATUS, CONTROL METHOD FOR SIGNAL PROCESSING APPARATUS, AND STORAGE MEDIUM

(71) Applicant: CANON KABUSHIKI KAISHA, Tokyo (JP)

(72) Inventor: Masanobu Funakoshi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 18/605,600

(22) Filed: Mar. 14, 2024

(65) Prior Publication Data

US 2024/0312155 A1 Sep. 19, 2024

(30) Foreign Application Priority Data

Mar. 16, 2023 (JP) ................................. 2023-042230

(51) Int. Cl.
| | |
|---|---|
| *G06T 19/00* | (2011.01) |
| *G06F 3/01* | (2006.01) |
| *G06F 3/16* | (2006.01) |
| *H03H 17/02* | (2006.01) |

(52) U.S. Cl.
CPC ............ *G06T 19/006* (2013.01); *G06F 3/016* (2013.01); *G06F 3/16* (2013.01); *H03H 17/0283* (2013.01)

(58) Field of Classification Search
CPC ......... G06T 19/006; G06F 3/016; G06F 3/16; H03H 17/0283
See application file for complete search history.

(56) References Cited

U.S. PATENT DOCUMENTS

| | | |
|---|---|---|
| 11,533,579 B2 | 12/2022 | Sakuma |
| 2010/0113140 A1* | 5/2010 | Kelly ...................... G07F 17/32 |
| | | 463/30 |
| 2018/0020312 A1* | 1/2018 | Visser .................... G06F 3/011 |

FOREIGN PATENT DOCUMENTS

JP 2021175043 A 11/2021

* cited by examiner

*Primary Examiner* — Jeffery A Brier
(74) *Attorney, Agent, or Firm* — Canon U.S.A., Inc. IP Division

(57) ABSTRACT

A signal processing apparatus includes one or more memories storing instructions, and one or more processors executing the instructions to acquire a sound characteristic generated by vibration depending on a real-world object with which a virtual object is in contact, in a virtual-reality display in which an image of the virtual object is superimposed and displayed on a real-world image, apply the acquired sound characteristic generated by vibration to a sound source signal of the virtual object, and reproduce a sound depending on the sound signal to which the sound characteristic generated by vibration is applied.

11 Claims, 11 Drawing Sheets

FIG.1

SIGNAL PROCESSING APPARATUS, CONTROL METHOD FOR SIGNAL PROCESSING APPARATUS, AND STORAGE MEDIUM

BACKGROUND

Field of the Disclosure

The present disclosure relates to a signal processing apparatus, a control method of the signal processing apparatus, and a storage medium.

Description of the Related Art

There is a technique for changing sound generated from a virtual object by reflecting a condition in the real world on the sound in a system called an augmented reality (AR) display system in which the virtual object is superimposed and displayed on the real world. Japanese Patent Application Laid-Open No. 2021-175043 discusses a technique which enables an augmented reality display system to adjust a synthetic sound to make a user feel as if the synthetic sound is coming from behind a real object with a virtual sound source behind the real object when viewed from the user.

Generation of a sound appropriate for a real object with which a virtual object is in contact, displayed in an augmented reality manner in which the virtual object is superimposed on the real world, allows production of an effect which makes a user feel as if the virtual object actually exists in the real world. However, with the technique discussed in Japanese Patent Application Laid-Open No. 2021-175043, diffraction of sound caused by the real object can be calculated and reflected thereon as long as the real object is located between the virtual sound source and a viewer's position, and the change of a sound caused by the virtual sound source being in contact with the real object cannot be expressed.

SUMMARY

According to an aspect of the present disclosure, a signal processing apparatus includes one or more memories storing instructions, and one or more processors executing the instructions to acquire a sound characteristic generated by vibration depending on a real-world object with which a virtual object is in contact, in a virtual-reality display in which an image of the virtual object is superimposed and displayed on a real-world image, apply the acquired sound characteristic generated by vibration to a sound source signal of the virtual object, and reproduce a sound depending on the sound signal to which the sound characteristic generated by vibration is applied.

Further features of various embodiments of the present disclosure will become apparent from the following description of exemplary embodiments with reference to the attached drawings.

BRIEF DESCRIPTION OF THE DRAWINGS

FIG. 1 is a block diagram illustrating an example of a functional configuration of a signal processing apparatus according to a first exemplary embodiment.

DESCRIPTION OF THE EMBODIMENTS

Hereinafter, exemplary embodiments of the present disclosure will be described with reference to the appended drawings. The embodiments described hereinafter are not intended to limit the scope of every embodiment, and not all of the combinations of features described in the exemplary embodiments are used. Further, like numbers refer to like elements in the description.

According to a first exemplary embodiment described, an example will be described of acquiring a generated sound characteristic of a real object (i.e., an object existing in the real world) with which a virtual sound source (virtual object) is in contact on a virtual-reality display in which an image of the virtual sound source (virtual object) is superimposed and displayed on an image of the real world, and applying the generated sound characteristic to a sound source signal. In the present exemplary embodiment, for the sake of simplicity, it is assumed that a sound associated with the virtual sound source (virtual object) is acquired as the sound source signal.

Figure 1:
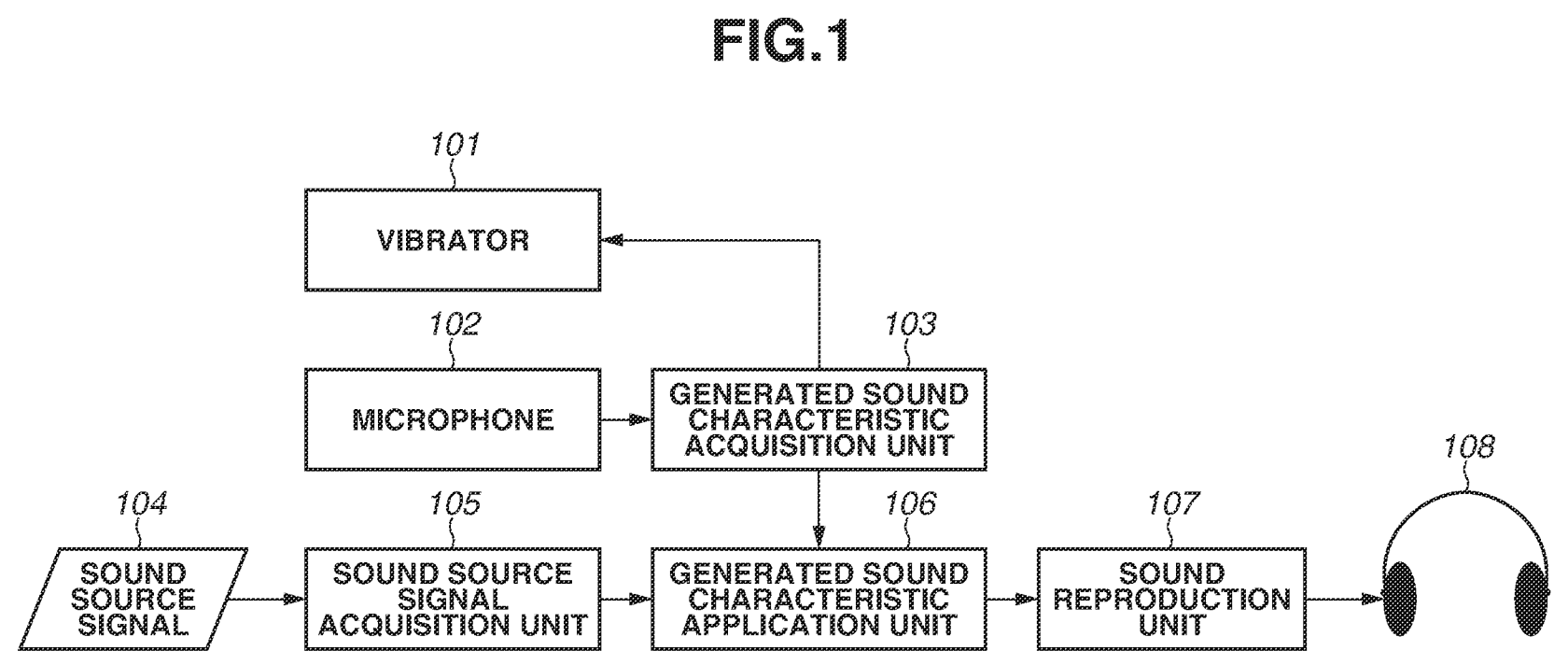

FIG. 1 is a block diagram illustrating an example of a functional configuration of a signal processing apparatus according to the present exemplary embodiment.

A vibrator 101 is mounted on a real object, and vibrates the real object with the vibrator 101 mounted thereon according to a measurement signal (e.g., a sound signal used for measurement) input thereto. This vibration generates a sound with a characteristic of a sound generated by vibration determined depending on various attributes, such as a size, an area, a material, and a structure of the object. A microphone 102 acquires (collects) a sound generated from the real object vibrated by the vibrator 101.

A generated sound characteristic acquisition unit 103 acquires a characteristic of a sound generated by vibrating the object. Hereinafter, a characteristic of the sound generated by vibrating the object is also called "sound characteristic generated by vibration". The generated sound characteristic acquisition unit 103 outputs a measurement signal to the vibrator 101 to vibrate the real object as an acquisition target of the generated sound characteristic. Further, generated sound characteristic acquisition unit 103 acquires the sound characteristic generated by vibration by analyzing the sound acquired by the microphone 102 based on the measurement signal. The generated sound characteristic acquisition unit 103 outputs the acquired sound characteristic generated by vibration to a generated sound characteristic application unit 106.

Figure 2:
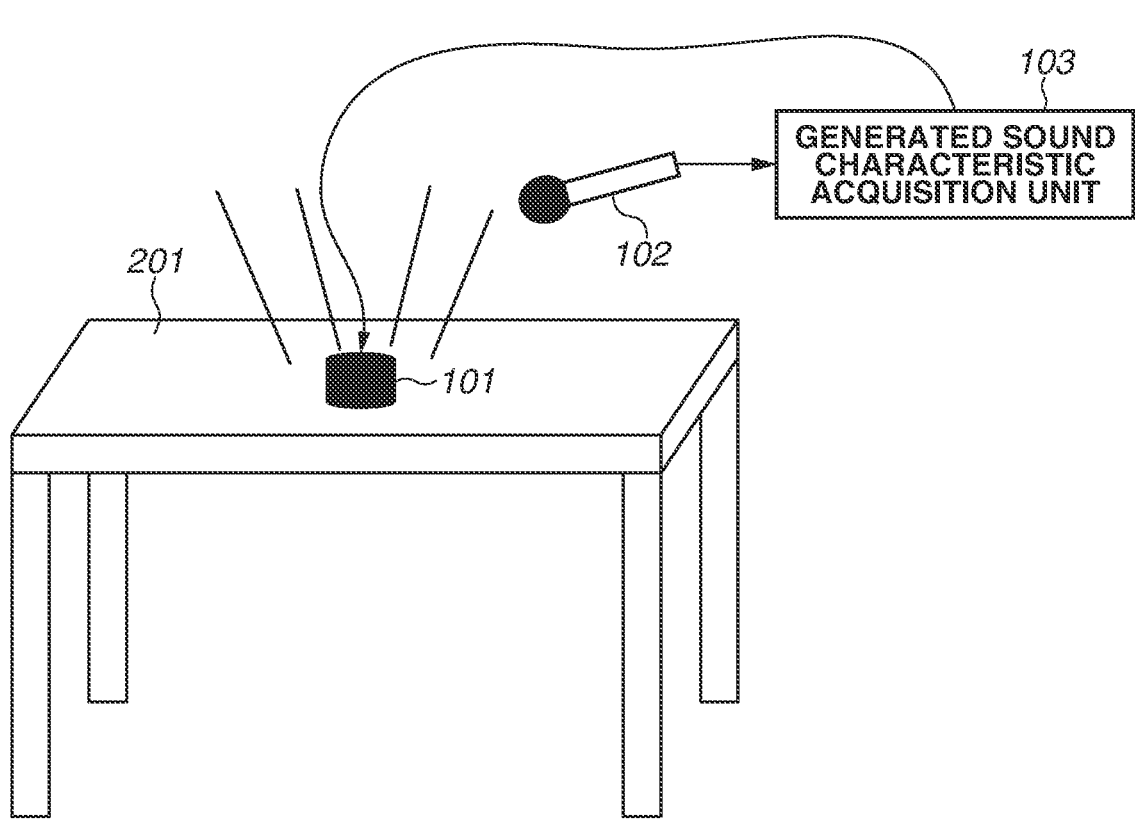
FIG. 2 is a diagram illustrating acquisition of a sound characteristic generated by vibration.

FIG. 2 is a conceptual diagram illustrating acquisition of a sound characteristic generated by vibration. In FIG. 2, like numbers refer to like constituent elements illustrated in FIG. 1. In the example illustrated in FIG. 2, a desk 201 is an acquisition target of a sound characteristic generated by vibration. The generated sound characteristic acquisition unit 103 outputs a measurement signal to the vibrator 101 mounted on the desk 201 to vibrate the desk 201, and acquires a characteristic of a sound generated by vibrating the desk 201 by the microphone 102 analyzing the acquired sound. The above-described processing allows the sound characteristic generated by vibration of a real object to be acquired.

Figure 3A:
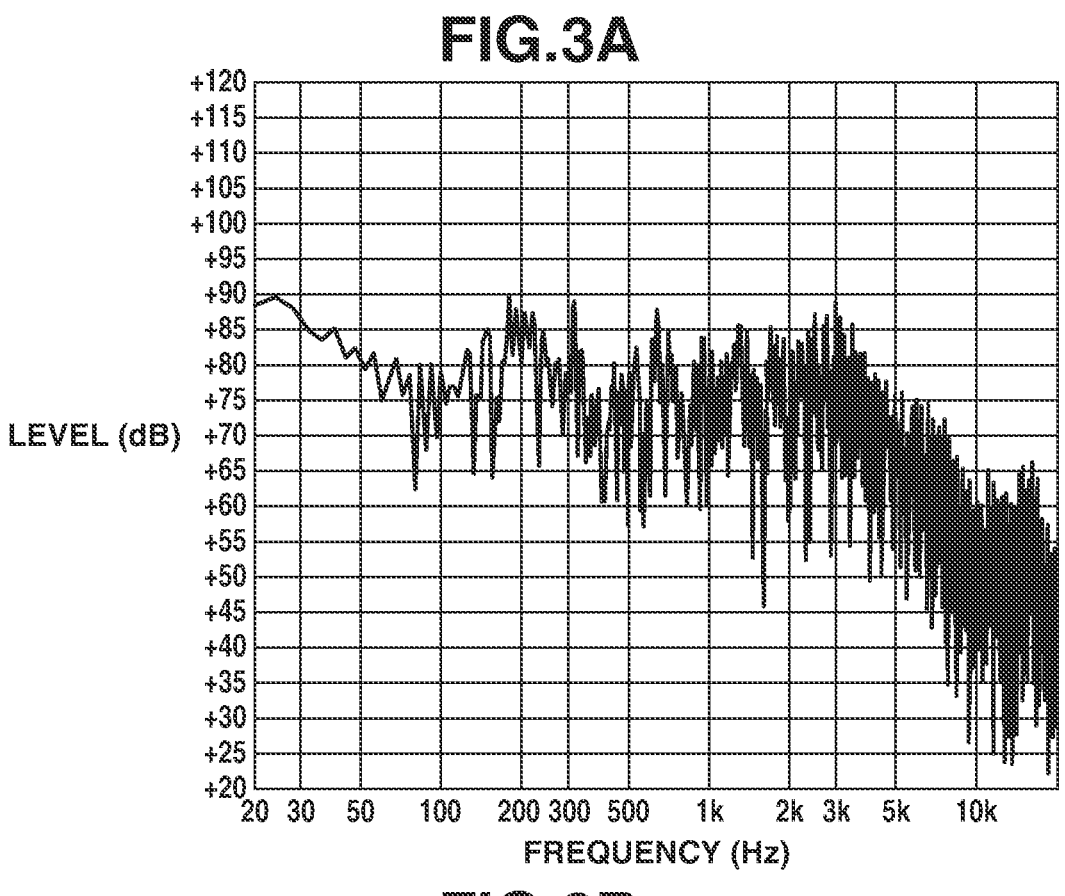
FIGS. 3A and 3B are graphs illustrating examples of frequency characteristics of sounds generated by vibration.
Figure 3B:
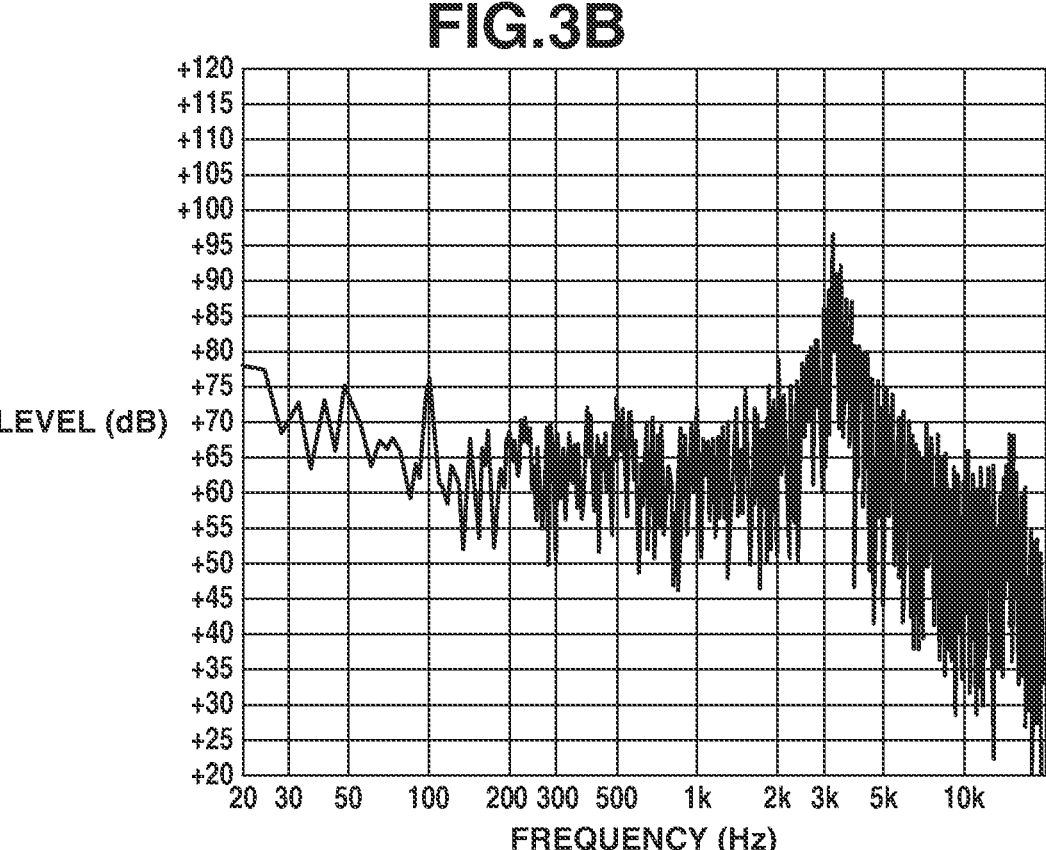

The sound characteristic generated by vibration will now be described. FIGS. 3A and 3B are graphs illustrating examples of frequency characteristics of sounds generated by actually vibrating an object existing in the real world. In each of the graphs in FIGS. 3A and 3B, the vertical axis represents sound pressure, and the horizontal axis represents frequency. FIG. 3A illustrates a frequency characteristic of a sound generated by vibrating a plywood desk generally used in offices. It is found that the sound characteristic generated by vibration of this desk keeps relatively flat up to a frequency of approximately 3 kHz. FIG. 3B illustrates a frequency characteristic of a sound generated by vibrating a small 10-centimeter-high cardboard box having a B4-size bottom face. The graph shows that the sound characteristic generated by vibration of this cardboard box has a great peak near frequencies of 3 kHz to 4 kHz, with very few components in the rest of the frequency range. Thus, the sound generated from the vibrated cardboard box becomes a harsh, rustling sound. As described above, the sound quality varies depending on the attribute of the vibrated object. Further, it appears as if the sound quality represents the attribute of the vibrated object.

Referring back to FIG. 1, a sound source signal acquisition unit 105 acquires a sound source signal 104, such as a musical composition, and outputs the acquired sound source signal 104 to the generated sound characteristic application unit 106. The sound source signal acquisition unit 105 reads the sound source signal 104 from a storage unit (not illustrated) as appropriate, and outputs the sound source signal 104 to the generated sound characteristic application unit 106. Further, the sound source signal 104 may include a signal of a musical composition relating to a virtual sound source (virtual object), such as background music (BGM), in addition to a signal of a sound generated from another virtual sound source (virtual object).

The generated sound characteristic application unit 106 applies the sound characteristic generated by vibration, output from the generated sound characteristic acquisition unit 103, to the sound source signal 104 received from the sound source signal acquisition unit 105. The sound source signal 104, to which the sound characteristic generated by vibration is applied, is output to the sound reproduction unit 107. The sound reproduction unit 107 appropriately amplifies the sound source signal 104 to which the sound characteristic generated by vibration is applied, received from the generated sound characteristic application unit 106, and outputs the amplified sound source signal 104 to a sound output device, such as a headphone 108 or a speaker. The headphone 108 is worn on a listener's head, and converts the sound source signal 104 output from the sound reproduction unit 107 into a sound to output the sound to the listener's ears.

Figure 4:
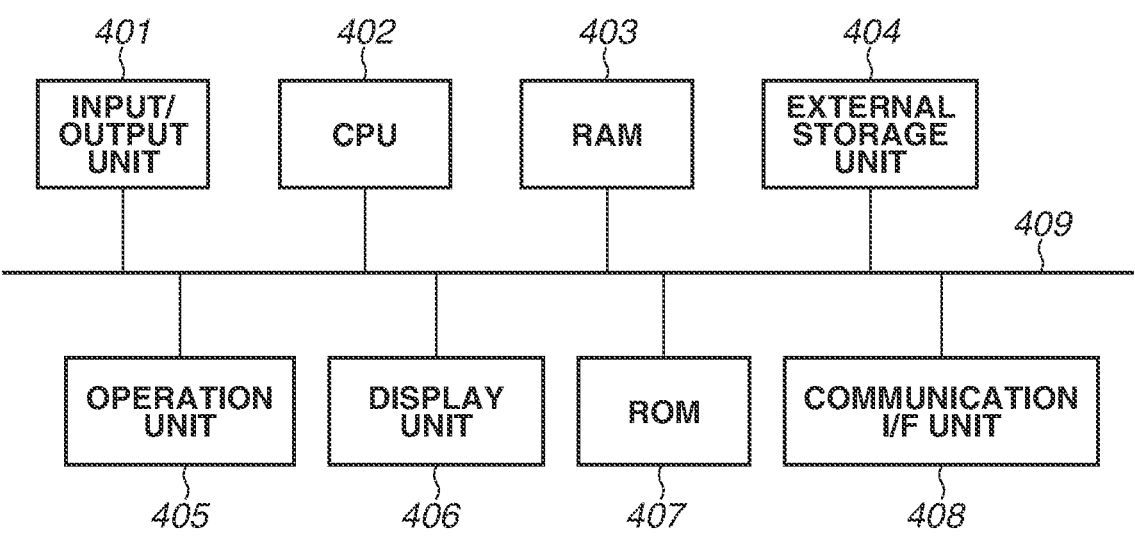
FIG. 4 is a block diagram illustrating a hardware configuration of the signal processing apparatus.

FIG. 4 is a diagram illustrating an example of a hardware configuration of the signal processing apparatus according to the present exemplary embodiment. The signal processing apparatus according to the present exemplary embodiment includes an input/output unit 401, a central processing unit (CPU) 402, a random-access memory (RAM) 403, an external storage unit 404, an operation unit 405, a display unit 406, a read-only memory (ROM) 407, a communication interface (I/F) unit 408, and a bus 409. The input/output unit 401, the CPU 402, the RAM 403, the external storage unit 404, the operation unit 405, the display unit 406, the ROM 407, and the communication I/F unit 408 are communicably connected to each other via the bus 409.

The input/output unit 401 receives the input of a microphone signal and a sound source signal from the outside and appropriately transmits the signals to another constituent element via the bus 409 according to an instruction from the CPU 402. Further, the input/output unit 401 appropriately performs processing on a sound source signal stored in the RAM 403 or the external storage unit 404 according to an instruction from the CPU 402, and transmits the sound source signal to an external sound output device, such as the headphone 108 or a speaker, via the bus 409.

The CPU 402 collectively controls the respective constituent elements that constitute the signal processing apparatus. According to programs, the CPU 402 controls the other constituent elements by transmitting control signals thereto via the bus 409, and also performs various types of calculation. In the present exemplary embodiment, the CPU 402 carries out the various functions illustrated in FIG. 1 by performing processing according to programs stored in the ROM 407 or the external storage unit 404.

The RAM 403 temporarily saves part of a running program, data associated therewith, and calculation results obtained by the CPU 402. The CPU 402 loads programs and data to the RAM 403 and runs programs by performing reading and writing as appropriately.

The external storage unit 404 stores a program main body and data accumulated over a long period of time. For example, the external storage unit 404 may be a hard disk drive (HDD) or a solid-state drive (SSD). The operation unit 405 receives various instructions and operations issued/performed by the user, converts the instructions and operations into control signals, and transmits the control signals to the CPU 402 via the bus 409. According to the control signals, the CPU 402 controls a running program, and issues control instructions to other constituent elements.

The display unit 406 displays a state and an output of a running program to the user. The ROM 407 stores fixed programs, such as a program for activating or deactivating the hardware apparatus and a program for controlling the basic input/output, and fixed parameters. The communication I/F unit 408 can perform data input/output with respect to a communication network, such as the internet.

Figure 5:
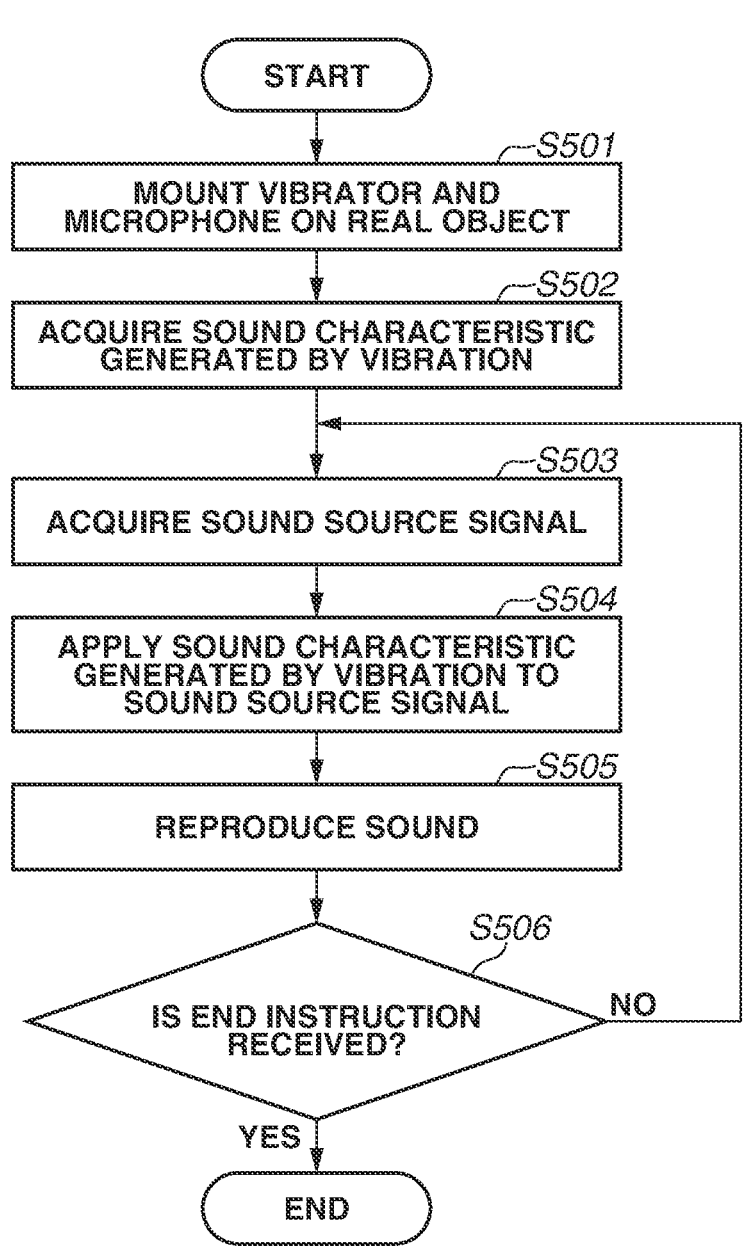
FIG. 5 is a flowchart illustrating an example of sound reproduction processing implemented by the signal processing apparatus.

Sound reproduction processing performed by the signal processing apparatus according to the present exemplary embodiment will now be described. FIG. 5 is a flowchart illustrating an example of the sound reproduction processing performed by the signal processing apparatus according to the present exemplary embodiment.

In step S501, the vibrator 101 is mounted on a real object from which a sound is to be generated, and the microphone 102 capable of collecting the sound generated from the real object is arranged near the real object. Herein, the real object from which the sound is to be generated is an object existing in the real world, with which a virtual sound source (virtual object) displayed in a virtual-reality is in contact. For example, the microphone 102 is arranged at a position 30 cm to 50 cm away from the surface on which the vibrator 101 is mounted.

In step S502, the generated sound characteristic acquisition unit 103 outputs a measurement signal to the vibrator 101 mounted on the real object, and the microphone 102 collects a sound generated by vibration of the vibrator 101. Then, the generated sound characteristic acquisition unit 103 acquires a sound characteristic generated by vibration of the real object by analyzing the sound collected by the microphone 102. The acquired sound characteristic generated by vibration is output to the generated sound characteristic application unit 106. The generated sound characteristic acquisition unit 103 outputs a measurement signal, such as a time stretched pulse (TSP) signal or a pink noise, to the vibrator 101 to analyze a signal of the sound generated from the real object and collected by the microphone 102. As a result, an impulse response is acquired. Further, the generated sound characteristic acquisition unit 103 adjusts the time length to an appropriate time length by eliminating the aliasing distortion therefrom, so that a finite impulse response (FIR) filter coefficient can be acquired as a sound characteristic generated by vibration. The generated sound characteristic acquisition processing performed in step S502 will be described below with reference to FIG. 6.

In step S503, the sound source signal acquisition unit 105 acquires a sound source signal for a next processing unit time from the sound source signal 104. The sound source signal acquisition unit 105 outputs the acquired sound source signal for the processing unit time to the generated sound characteristic application unit 106. For example, the processing unit time is a time taken to perform a series of processing in steps S503 to S505.

In step S504, the generated sound characteristic application unit 106 applies the sound characteristic generated by vibration acquired in step S502 to the sound source signal acquired in step S503. The generated sound characteristic application unit 106 performs filter processing on the sound source signal acquired in step S503 by using the FIR filter having the filter coefficient acquired in step S502. After the sound characteristic generated by vibration is applied to the sound source signal, the sound source signal is output to the sound reproduction unit 107.

In step S505, the sound reproduction unit 107 appropriately performs adjustment and amplification of the sound source signal to which the sound characteristic generated by vibration is applied in step S504, and outputs the sound source signal to the headphone 108.

The headphone 108 converts the sound source signal received from the sound reproduction unit 107 into a sound, and brings the sound to the listener's ears. This configuration allows the listener to listen to the sound to which the sound characteristic generated by vibration of the real object with which the virtual object displayed in the virtual-reality is in contact is applied.

In step S506, the CPU 402 of the signal processing apparatus determines whether an end instruction for ending the sound reproduction processing is issued through a user operation performed on the operation unit 405. If the CPU 402 determines that the end instruction is not issued (NO in step S506), the sound reproduction processing is continued, the processing returns to step S503, and the sound reproduction processing is performed on the sound source signal for the next processing unit time. If the CPU 402 determines that the end instruction is issued (YES in step S506), the sound reproduction processing is ended.

Figure 6:
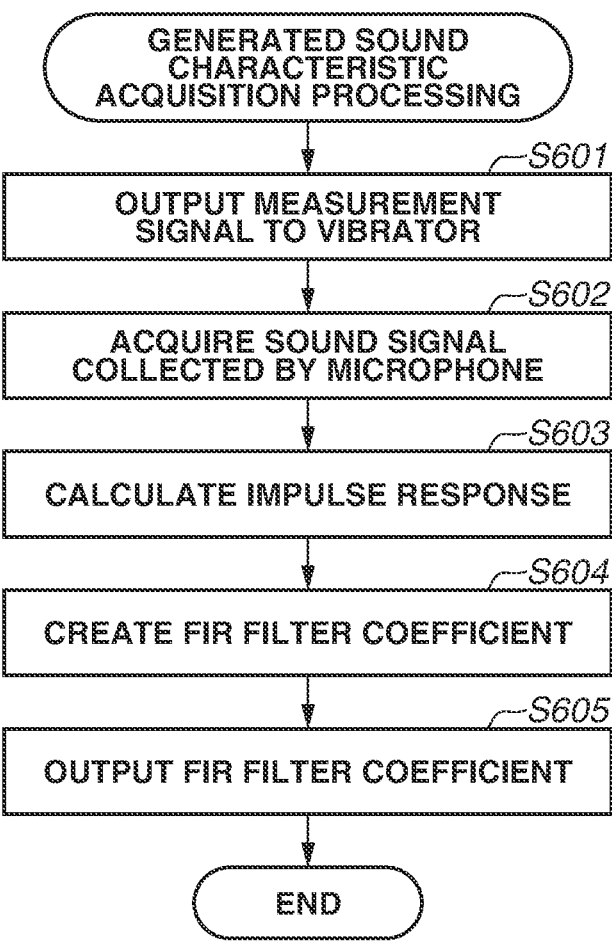
FIG. 6 is a flowchart illustrating an example of generated sound characteristic acquisition processing.

FIG. 6 is a flowchart illustrating an example of the generated sound characteristic acquisition processing in step S502 of FIG. 5. All of the generated sound characteristic acquisition processing illustrated in FIG. 6 is performed by the generated sound characteristic acquisition unit 103.

In step S601, the generated sound characteristic acquisition unit 103 outputs a measurement signal (i.e., sound signal used for measurement), such as a TSP signal, to the vibrator 101 mounted on the real object. A signal in an audible frequency range, e.g., a frequency range of 5 Hz to 20 kHz, is used as the measurement signal. The above-described signal is merely an example, and a signal in another frequency range, such as a signal including a frequency range other the audible frequency range, can also be used.

In step S602, the generated sound characteristic acquisition unit 103 acquires a signal of a sound generated by vibration of the vibrator 101 and collected by the microphone 102.

In step S603, based on the measurement signal output to the vibrator 101 in step S601, the generated sound characteristic acquisition unit 103 performs analysis processing on the sound signal collected and acquired by the microphone 102 in step S602, and calculates an impulse response. This processing is known processing commonly performed in the field of sound analysis, and descriptions thereof are omitted.

In step S604, in order to eliminate aliasing distortion, the generated sound characteristic acquisition unit 103 performs processing on the impulse response acquired in step S603 to eliminate a high-frequency range other than the audible frequency range by using a low-pass filter. Further, with respect to the impulse response processed by the low-pass filter, the generated sound characteristic acquisition unit 103 performs processing for adjusting the time length to a predetermined time length, and creates a FIR filter coefficient having a prescribed length (i.e., the number of taps). In consideration of the processing in applying the FIR filter, the generated sound characteristic acquisition unit 103 normally adjusts the length of the coefficient to 2 to the power of N.

In step S605, as a sound characteristic generated by vibration of the target real object, the generated sound characteristic acquisition unit 103 outputs the FIR filter coefficient created in step S604 to the generated sound characteristic application unit 106. After completing the processing in step S605, the generated sound characteristic acquisition unit 103 completes the generated sound characteristic acquisition processing, so that the processing returns to the sound reproduction processing illustrated in FIG. 5. By applying the FIR filter acquired as described above to the sound source signal through the processing in step S504 of FIG. 5, the sound characteristic generated by vibration is applied to the sound source signal, so that change of a sound caused by the virtual sound source coming into contact with the real object can be expressed.

According to the present exemplary embodiment, the sound characteristic generated by vibration of the real object with which the virtual sound source (virtual object) displayed in the virtual reality is in contact is acquired and applied to the sound source signal, so that change of a sound caused by the virtual sound source coming into contact with the real object can be expressed. Through the above-described processing, a sound which makes the user feel as if the virtual sound source (virtual object) displayed in a virtual-reality is in contact with the real object can be generated, allowing reproduction of a sound which makes the user feel as if the virtual sound source (virtual object) actually exists in the real world.

In the above-described exemplary embodiment, the example has been described in which the FIR filter coefficient is acquired in the generated sound characteristic acquisition processing. Some embodiments of the present disclosure are not limited to the above-described example, and another method can also be employed. For example, an infinite impulse response (IIR) filter coefficient may be acquired by designing an IIR filter approximated to the frequency characteristic of a sound generated by vibration.

A second exemplary embodiment will be described. In the first exemplary embodiment, the example has been described in which a characteristic of a sound generated when a real object is vibrated is acquired, and the acquired characteristic is applied to a sound source signal. In the present exemplary embodiment, an example will be described in which, if a virtual object in a three-dimensional shape as a virtual sound source is to be displayed together with a real-world image in an augmented reality manner, a characteristic of a sound appropriate for an object located at the display position of the virtual object is acquired from a database and applied to a sound source signal. The description of the components and pieces of processing as the same as those in the first exemplary embodiment will be omitted. Further, in the following description, a virtual object serving as a virtual sound source is also called a virtual sound source object.

Figure 7:
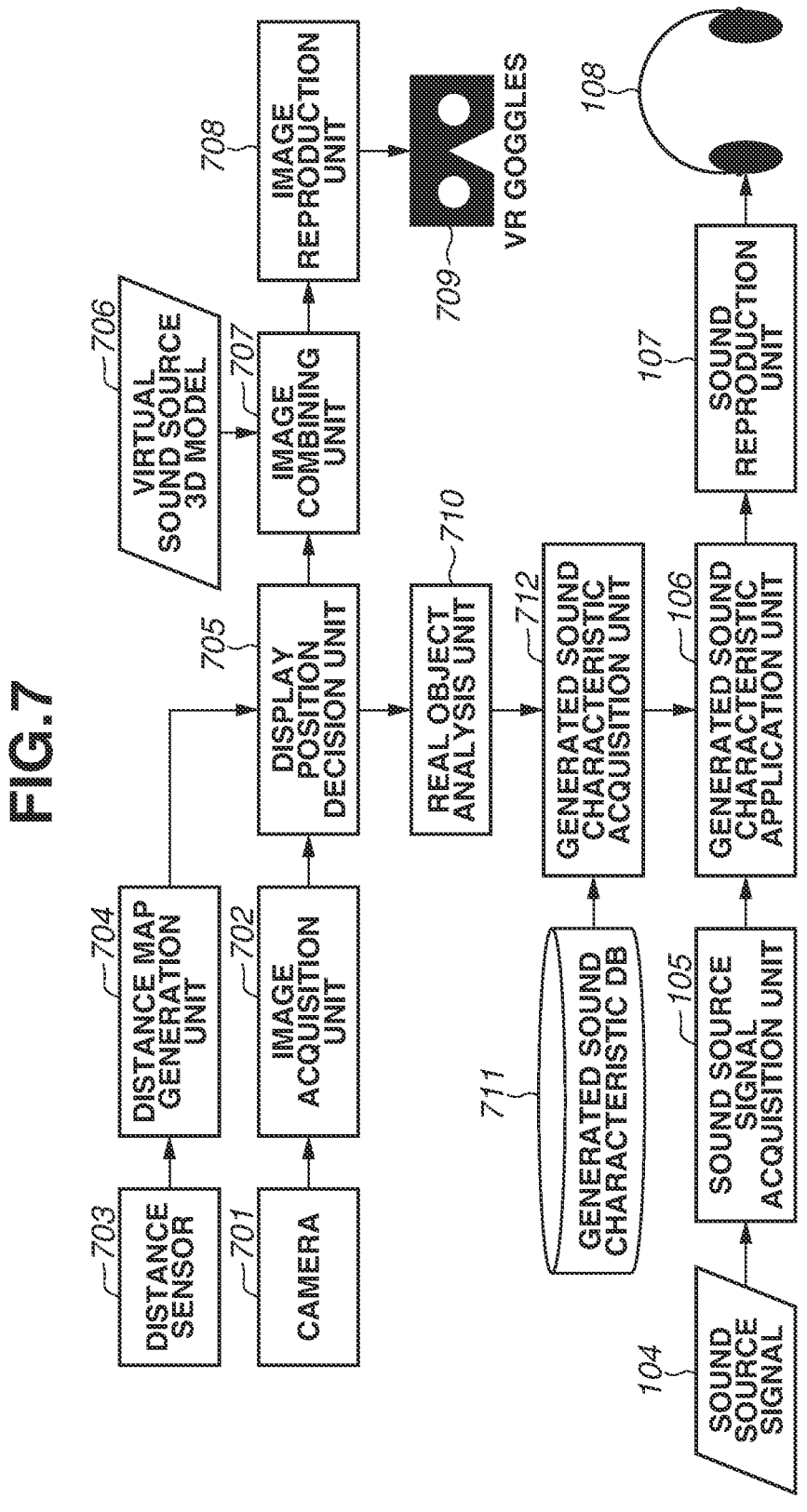
FIG. 7 is a block diagram illustrating an example of a functional configuration of a signal processing apparatus according to a second exemplary embodiment.

FIG. 7 is a diagram illustrating an example of a functional configuration of a signal processing apparatus according to the present exemplary embodiment. In FIG. 7, like numbers refer to like constituent elements illustrated in FIG. 1, and the duplicative descriptions thereof will be omitted.

A camera 701 is mounted on a surface of a pair of virtual-reality (VR) goggles 709. The camera 701 captures images in the real world in front of the VR goggles 709, and outputs electric signals relating to the captured images acquired through a built-in sensor to an image acquisition unit 702. The image acquisition unit 702 acquires image signals of the real world by performing development processing on the electric signals received from the camera 701, and outputs the image signals to a display position decision unit 705.

A distance sensor 703 is mounted on a surface of the VR goggles 709. The distance sensor 703 scans the real world in front of the VR goggles 709 in a range corresponding to the angle of view of the camera 701, acquires pieces of distance information at respective points in the scanned range, and outputs the pieces of distance information to a distance map generation unit 704. The distance map generation unit 704 generates a distance map of the range corresponding to the angle of view of the camera 701 based on the pieces of distance information received from the distance sensor 703, and outputs the distance map to the display position decision unit 705.

The display position decision unit 705 decides on a display position where the virtual sound source object is to be combined and displayed in a real-world image captured by the camera 701. The display position decision unit 705 analyzes the state of the real world based on the image signals output from the image acquisition unit 702 and the distance map output from the distance map generation unit 704. Then, the display position decision unit 705 searches for a position where the virtual sound source object can naturally be combined and displayed in the real world, and decides on that position as a display position. For example, the display position decision unit 705 searches for a contact surface (e.g., horizontal surface) where the virtual sound source object can be combined and displayed in the real world, and decides on that contact surface as a display position of the virtual sound source object. The above-described processing is known processing commonly performed in the field of augmented reality image generation, and the descriptions thereof are omitted. The display position decision unit 705 outputs the real-world image and the decided display position of the virtual sound source object to an image combining unit 707 and a real object analysis unit 710.

The image combining unit 707 renders the virtual sound source object into a three-dimensional (3D) object based on a virtual sound source 3D model 706, and combines the rendered virtual sound source object with the real-world image at the display position output from the display position decision unit 705. The virtual sound source 3D model 706 stores information, such as a color and a shape, of the virtual sound source object. The image combining unit 707 outputs the image generated by combining the virtual sound source object to the image reproduction unit 708. The image reproduction unit 708 converts the image output from the image combining unit 707 into an image in a display format appropriate for the VR goggles 709, and outputs the converted image to the VR goggles 709. The pair of VR goggles 709 is mounted on a viewer, and displays the image received from the image reproduction unit 708. This configuration allows the viewer to see the image in which the virtual object as a virtual sound source and the real world are combined. In the present exemplary embodiment, the pair of VR goggles 709 that displays an image through a video see-through display method will be described as an example. However, the pair of VR goggles 709 may display an image through an optical see-through display method.

Based on the real-world image and the display position of the virtual sound source object output from the display position decision unit 705, the real object analysis unit 710 analyzes what the real object located at the display position of the virtual sound source object is. For example, the real object analysis unit 710 can acquire the model number and specifications of the object by extracting a part of the object from the real-world image and performing image search on a cloud server on the network. The above-described image analysis processing is a known technique commonly performed by using a smartphone, and the descriptions thereof are omitted. The real object analysis unit 710 outputs the analysis result of the real object (e.g., the model number and specifications of the real object) to a generated sound characteristic acquisition unit 712.

A generated sound characteristic database (DB) 711 stores a plurality of sound characteristics generated by vibration of a plurality of real objects, used for displaying the virtual sound source in contact with a real object. The generated sound characteristic DB 711 is an example of a characteristic storage unit. Sound characteristics generated by vibration of various real objects are stored in the generated sound characteristic DB 711 together with the attribute information on these real objects. Various types of data stored in the generated sound characteristic DB 711 are created by previously measuring sound characteristics generated by vibration of various real objects and acquiring various attributes from specification tables and actual measurement values. Hereinafter, data stored in this generated sound characteristic DB 711 is also called information on a sound characteristic generated by vibration. The information on a sound characteristic generated by vibration will be described below in detail.

The generated sound characteristic acquisition unit 712 searches the generated sound characteristic DB 711 based on the analysis result of the real object output from the real object analysis unit 710, and acquires a sound characteristic generated by vibration depending on the real object located at the display position of the virtual sound source object. Based on the analysis result of the real object output from the real object analysis unit 710, the generated sound characteristic acquisition unit 712 searches the generated sound characteristic DB 711 based on the attribute information (various attributes) of the real object. As a result, the generated sound characteristic acquisition unit 712 acquires a sound characteristic generated by vibration of an object whose attribute information has the highest correlation with the attribute information of the real object located at the display position of the virtual sound source object (i.e., whose attribute is the closest to the attribute of the real object) from the data stored in the generated sound characteristic DB 711. The generated sound characteristic acquisition unit 712 outputs the acquired sound characteristic generated by vibration to the generated sound characteristic application unit 106.

A hardware configuration of the signal processing apparatus according to the present exemplary embodiment is similar to that of the first exemplary embodiment, so that descriptions thereof will be omitted.

Figure 8:
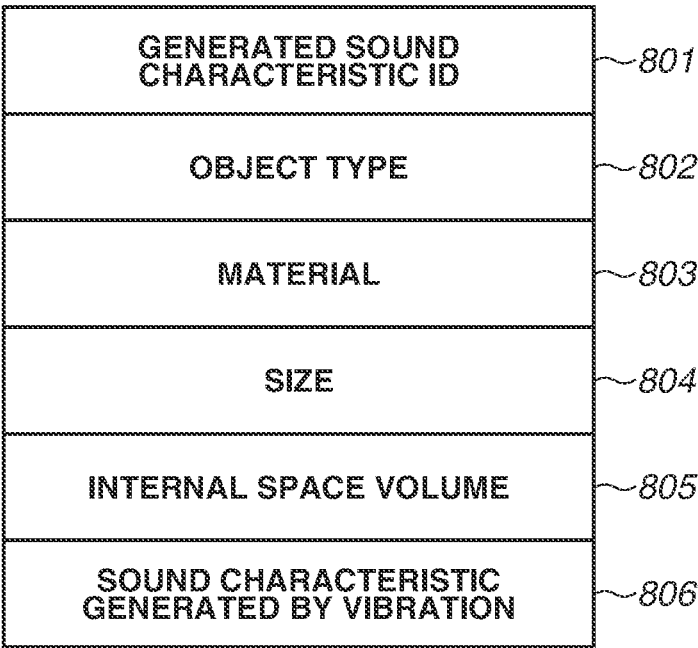
FIG. 8 is a table illustrating an example of data configuration of information about a sound characteristic generated by vibration.

Data configuration of information on a sound characteristic generated by vibration stored in the generated sound characteristic DB 711 will be described with reference to FIG. 8. FIG. 8 is a table illustrating an example of a data configuration of information on a sound characteristic generated by vibration. As illustrated in FIG. 8, the information on a sound characteristic generated by vibration includes a generated sound characteristic identification (ID) 801, and an object type 802, a material 803, a size 804, and an internal space volume 805 as pieces of attribute information, and a sound characteristic generated by vibration 806. A plurality of pieces of information on a sound characteristic generated by vibration as illustrated in FIG. 8 is stored in the generated sound characteristic DB 711.

The generated sound characteristic ID 801 is an ID number for identifying information on a sound characteristic generated by vibration, and this ID number is uniquely applied to each of the pieces of information on a sound characteristic generated by vibration. The object type 802 refers to the type of a real object from which this information on a sound characteristic generated by vibration is acquired. For example, the object type 802 is information indicating a desk, a shelf, or a box. The material 803 refers to a material that forms a real object from which this information on a sound characteristic generated by vibration is acquired. For example, the material 803 is information indicating steel, plywood, cedarwood, plastic, or corrugated paper. The size 804 refers to the size (e.g., a width, a depth, and a height) of a real object from which this information on a sound characteristic generated by vibration is acquired. The internal space volume 805 refers to the volume of an internal space inside a real object from which this information on a sound characteristic generated by vibration is acquired. An object with no internal space has a value of 0 as the internal space volume 805. The above attribute is included because internal reflection of sound is changed depending on an internal space when an object with an internal space is vibrated.

Each of the above-described constituent elements (i.e., the object type 802, the material 803, the size, 804, and the internal space volume 805) of information on a sound characteristic generated by vibration has a great influence on a sound characteristic generated by vibration. Thus, it can be understood that the higher of degree of similarity of the constituent elements described above two objects have, the more approximate sound characteristics generated by vibration of two objects are. Thus, the generated sound characteristic acquisition unit 712 can acquire a generated sound characteristic appropriate for the real object by searching for data that has a high degree of similarity, from among the pieces of information on a sound characteristic generated by vibration stored as a key in the generated sound characteristic DB. In the present exemplary embodiment, while the example has been described of including the object type 802, the material 803, the size 804, and the internal space volume 805 of an object as the attribute information, data included as the attribute information is not limited thereto, and another attribute may also be stored.

The sound characteristic generated by vibration 806 is a characteristic of a sound generated by vibrating an object (i.e., a sound characteristic generated by vibration), acquired through a method similar to the generated sound characteristic acquisition processing in FIG. 6 described in the first exemplary embodiment. For example, the sound characteristic generated by vibration 806 is stored in a form of a FIR filter coefficient or an IIR filter coefficient directly applicable to the sound source signal.

Figure 9:
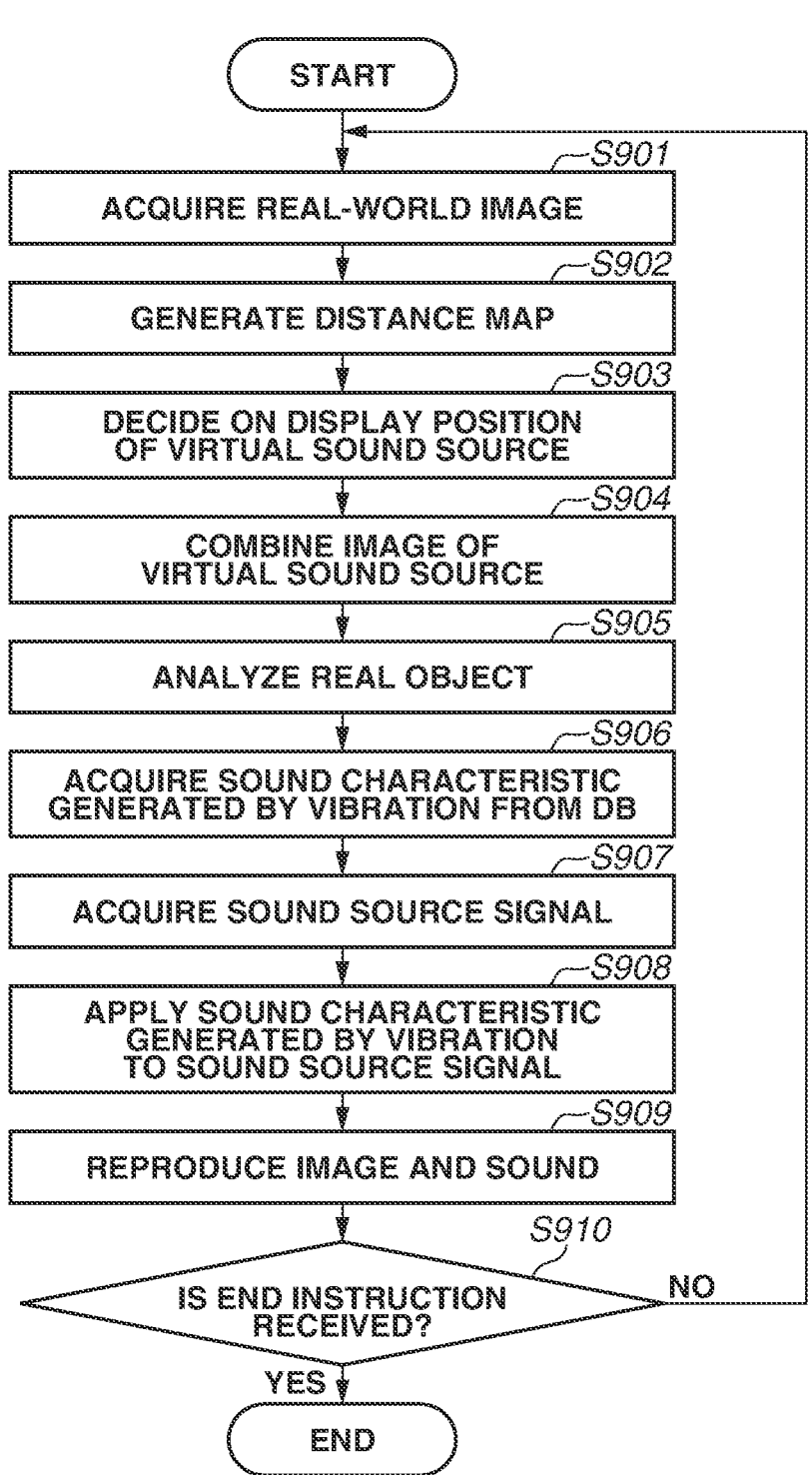
FIG. 9 is a flowchart illustrating an example of image/sound reproduction processing performed by the signal processing apparatus according to the second exemplary embodiment.

The image/sound reproduction processing performed by the signal processing apparatus according to the present exemplary embodiment will be described. FIG. 9 is a flowchart illustrating an example of the image/sound reproduction processing performed by the signal processing apparatus according to the present exemplary embodiment.

In step S901, the image acquisition unit 702 acquires a real-world image captured by the camera 701. The image acquisition unit 702 outputs the acquired real-world image to the display position decision unit 705.

In step S902, the distance map generation unit 704 generates a distance map of a range corresponding to the angle of view of the camera 701. First, the distance sensor 703 scans the real world in the range corresponding to the angle of view of the camera 701, acquires a distance at each of points in the scanned range, and outputs the acquired distance to the distance map generation unit 704. The distance map generation unit 704 generates a distance map of a range corresponding to the angle of view of the camera 701 based on distance information received from the distance sensor 703. The distance map generation unit 704 outputs the generated distance map to the display position decision unit 705.

In step S903, the display position decision unit 705 analyzes the state of the real world based on the real-world image acquired in step S901 and the distance map generated in step S902, and decides on the display position of the virtual sound source object. For example, the display position decision unit 705 performs analysis by using the real-world image and the distance map, searches for a horizontal surface having a size sufficient for displaying the 3D model for the virtual sound source, and decides on the display position of the virtual sound source object. The above-described processing is known processing commonly performed in the field of the augmented reality display, and the descriptions thereof are omitted. The display position decision unit 705 outputs the decided display position of the virtual sound source object and the real-world image to the image combining unit 707 and the real object analysis unit 710.

In step S904, the image combining unit 707 combines the image relating to the virtual sound source object and the real-world object. The image combining unit 707 renders the virtual sound source object into a three-dimensional shape based on the virtual sound source 3D model 706, and scales the rendered virtual sound source object to a size appropriate for the size of the surface of the display position decided in step S903. Then, the image combining unit 707 combines the virtual sound source object scaled according to the size of the surface of the display position with the real-world image at the display position decided in step S903. The above-described processing is known processing commonly performed in the field of the virtual reality display, and the descriptions thereof are omitted. The image combining unit 707 outputs the combined image to the image reproduction unit 708.

In step S905, the real object analysis unit 710 analyzes what the real object located at the display position of the virtual sound source object decided in step S903 in the real-world image is, and acquires the product name and the model number as an analysis result of the real object. The real object analysis unit 710 outputs the acquired information on the real object to the generated sound characteristic acquisition unit 712.

In step S906, the generated sound characteristic acquisition unit 712 searches for information on a generated sound characteristic stored in the generated sound characteristic DB 711 based on the information, such as the product name and the model number of the real object acquired in step S905. Through the above processing, the generated sound characteristic acquisition unit 712 acquires a sound characteristic generated by vibration most appropriate for the real object located at the display position of the virtual sound source object from among the sound characteristics generated by vibration stored in the generated sound characteristic DB 711. The generated sound characteristic acquisition unit 712 outputs the acquired sound characteristic generated by vibration to the generated sound characteristic application unit 106. The processing for acquiring a generated sound characteristic from the generated sound characteristic DB 711, performed in step S906, will be described below in detail with reference to FIG. 10.

The processing in steps S907 and S908 is similar to the processing in steps S503 and S504 in FIG. 5 described in the first exemplary embodiment, and the descriptions thereof are omitted.

In step S909, the image reproduction unit 708 and the sound reproduction unit 107 performs reproduction processing of an image and a sound relating to the virtual reality display. The image reproduction unit 708 converts the combined image acquired in step S904 (i.e., an image in which the image relating to the virtual sound source object and the real-world image are combined) into an image of a format appropriate for the VR goggles 709, and reproduces and displays the converted image on the VR goggles 709. Further, the sound reproduction unit 107 appropriately amplifies and reproduces the sound source signal to which the sound characteristic generated by vibration is applied in step S908, and makes the headphone 108 output the sound. The above processing allows the viewer to listen to the sound having a sound quality appropriate for the real object with which the virtual sound source object is in contact, while viewing the virtual reality image displaying the virtual sound source object.

The processing in step S910 is similar to the processing in step S506 of FIG. 5 described in the first exemplary embodiment, and the descriptions thereof are omitted.

Figure 10:
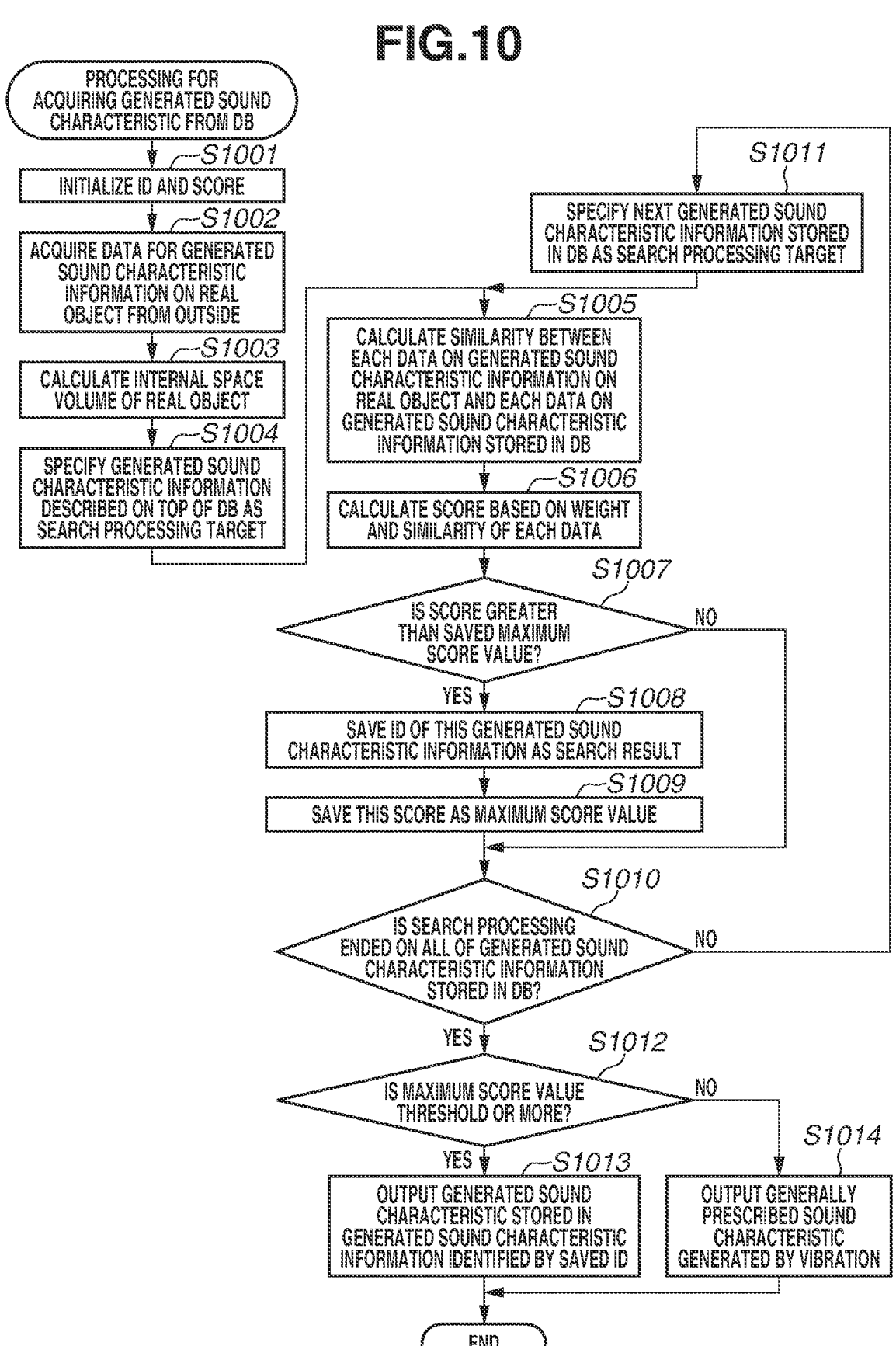
FIG. 10 is a flowchart illustrating an example of processing for acquiring a generated sound characteristic from a generated sound characteristic database (DB).

FIG. 10 is a flowchart illustrating an example of the processing for acquiring a generated sound characteristic from the generated sound characteristic DB 711 performed in step S906 of FIG. 9. All of the processing for acquiring a generated sound characteristic from the generated sound characteristic DB 711 illustrated in FIG. 10 is performed by the generated sound characteristic acquisition unit 712.

In step S1001, the generated sound characteristic acquisition unit 712 initializes a generated sound characteristic ID and a maximum score value stored in the generated sound characteristic acquisition unit 712. These values are stored when a generated sound characteristic ID and a score regarded as a search result of the generated sound characteristic DB 711 are acquired through the subsequent processing. In the initialization processing in step S1001, for example, the generated sound characteristic acquisition unit 712 saves an invalid value for the generated sound characteristic ID and saves 0 as the maximum score value.

In step S1002, based on the information, such as the product name and the model number of the real object acquired in step S905, the generated sound characteristic acquisition unit 712 acquires data acquirable from the outside, the data constituting information on a generated sound characteristic of this real object. For example, the generated sound characteristic acquisition unit 712 searches the internet by using the information, such as a product name and a model number, to acquire information on the real object, such as a specification table. Then, from the acquired information, the generated sound characteristic acquisition unit 712 acquires information relating to an object type, a material, and a size as information on a generated sound characteristic.

In step S1003, the generated sound characteristic acquisition unit 712 calculates the internal space volume of the real object based on the information acquired in step S1002. For example, the generated sound characteristic acquisition unit 712 sets 0 to the internal space volume when the object type is a desk, and calculates the volume of a cuboid having a size identical to the size of the object as the internal space volume when the object type is a box.

In step S1004, the generated sound characteristic acquisition unit 712 selects a first piece of information on a generated sound characteristic from the pieces of information on a sound characteristic generated by vibration stored in the generated sound characteristic DB 711, and specifies that information on a generated sound characteristic as a search processing target.

In step S1005, the generated sound characteristic acquisition unit 712 calculates the degree of similarity between each of the pieces of data constituting the information on a generated sound characteristic of the real object acquired in steps S1002 and S1003 and the corresponding piece of data constituting the information on a generated sound characteristic selected in step S1004 stored in the generated sound characteristic DB 711. The degree of similarity calculated in step S1005 is the degree of similarity between generated sound characteristics affected by each data. For example, the degree of similarity can be acquired through the following calculation. With regard to the object type and the material, a combined characteristic is acquired by combining generated sound characteristics whose data values stored in the generated sound characteristic DB 711 are the same, and the degree of similarity is acquired by calculating the degree of correlation between combined generated sound characteristics. With regard to the size and the internal space, each piece of data is categorized into small (S), medium (M), and large (L) based on magnitude of the size or the internal space. Then, a combined characteristic is acquired by combining generated sound characteristics for each category, and the degree of similarity is acquired by calculating the degree of correlation between combined generated sound characteristics. The degrees of similarity between data values can previously be calculated and stored in the generated sound characteristic DB 711 in a form of a comparison table. In this way, with respect to each piece of data on two pieces of information about a generated sound characteristic which are to be compared to each other, the generated sound characteristic acquisition unit 712 can acquire the degree of similarity by searching the comparison table after checking which category the data belongs to.

In step S1006, based on a predetermined weight of each piece of data and the degree of similarity between the pieces of data calculated in step S1005, the generated sound characteristic acquisition unit 712 calculates a score relating to the information on a generated sound characteristic specified as a search processing target. For example, the generated sound characteristic acquisition unit 712 calculates the product of a weight and the degree of similarity with respect to each piece of data constituting information on a generated sound characteristic, and acquires a score by adding up the calculated products. Herein, the weight of each piece of data is previously decided depending on the magnitude of influence that data value exerts on the generated sound characteristic. With regard to calculation of a weight, a generated sound characteristic used as a reference is specified, and a weight can be acquired by calculating the degree of variation of a combined generated sound characteristic of data values or categorized data values with respect to the generated sound characteristic specified as a reference. The weight can previously be calculated and stored in the generated sound characteristic DB 711 in a form of a table. The generated sound characteristic acquisition unit 712 can acquire the weight of each piece of data with reference to the table.

In step S1007, the generated sound characteristic acquisition unit 712 compares the score calculated in step S1006 and the maximum score value saved by the generated sound characteristic acquisition unit 712. As a result of the comparison, if the generated sound characteristic acquisition unit 712 determines that the score calculated in step S1006 is greater than the saved maximum score value (YES in step S1007), the processing in step S1008 is performed. If the generated sound characteristic acquisition unit 712 determines that the calculated score is not greater than the saved maximum score value (NO in step S1007), the processing in step S1010 is performed.

In step S1008, the generated sound characteristic acquisition unit 712 saves, as a result of the search processing, a generated sound characteristic ID of the information on a generated sound characteristic specified as a search processing target in a prescribed area in the RAM 403. If another generated sound characteristic ID is saved already, the generated sound characteristic acquisition unit 712 saves the generated sound characteristic ID by overwriting the existing generated sound characteristic ID with the generated sound characteristic ID of the information on a generated sound characteristic specified as a search processing target.

In step S1009, the generated sound characteristic acquisition unit 712 saves as the maximum score value the score relating to the information on a generated sound characteristic specified as a search processing target, calculated in step S1006. If another maximum score value is saved already, the generated sound characteristic acquisition unit 712 saves the maximum score value by overwriting the existing maximum score value with the score relating to the information on a generated sound characteristic specified as a search processing target.

In step S1010, the generated sound characteristic acquisition unit 712 determines whether the search processing is ended on all of the pieces of information on a generated sound characteristic stored in the generated sound characteristic DB 711. If the generated sound characteristic acquisition unit 712 determines that information on a generated sound characteristic which is not processed through the search processing is included in the pieces of information on a generated sound characteristic stored in the generated sound characteristic DB 711 (NO in step S1010), the processing in step S1011 is performed. On the other hand, if the generated sound characteristic acquisition unit 712 determines that the search processing is ended on all of the pieces of information on a generated sound characteristic stored in the generated sound characteristic DB 711 (YES in step S1010), the processing proceeds to step S1012, and the processing in step S1012 is performed.

In step S1011, the generated sound characteristic acquisition unit 712 selects the next piece of information on a generated sound characteristic from the pieces of information on a sound characteristic generated by vibration stored in the generated sound characteristic DB 711, and specifies that information on a generated sound characteristic as a search processing target. After the processing in step S1011 is performed, the processing in step S1005 is performed. In other words, after selecting unprocessed information on a generated sound characteristic from the pieces of information on a sound characteristic generated by vibration stored in the generated sound characteristic DB 711 in step S1011, the generated sound characteristic acquisition unit 712 performs the search processing on the information on a generated sound characteristic selected in step S1011.

In step S1012, the generated sound characteristic acquisition unit 712 determines whether the maximum score value acquired through the processing up to this point is a predetermined threshold or more. Based on this threshold determination, the generated sound characteristic acquisition unit 712 determines whether the sound characteristic generated by vibration, acquired as a result of the search processing, is appropriate for the real object. If the generated sound characteristic acquisition unit 712 determines that the maximum score value is a threshold or more (YES in step S1012), the processing proceeds to step S1013, and the processing in step S1013 is performed. If the generated sound characteristic acquisition unit 712 determines that the maximum score value is not a threshold or more, and is less than the threshold (NO in step S1012), the processing proceeds to step S1014, and the processing in step S1014 is performed.

In step S1013, the generated sound characteristic acquisition unit 712 outputs to the generated sound characteristic application unit 106 a sound characteristic generated by vibration, which is stored in the information on a generated sound characteristic identified by the generated sound characteristic ID that the generated sound characteristic acquisition unit 712 has saved as a search result. After ending the processing in step S1013, the generated sound characteristic acquisition unit 712 ends the processing for acquiring a generated sound characteristic from the generated sound characteristic DB 711, so that the processing returns to the image/sound reproduction processing illustrated in FIG. 9.

In step S1014, the generated sound characteristic acquisition unit 712 outputs a generally prescribed sound characteristic generated by vibration to the generated sound characteristic application unit 106 instead of outputting the sound characteristic generated by vibration identified by the generated sound characteristic ID acquired as a search result. Herein, for example, a generally prescribed sound characteristic generated by vibration refers to a prescribed generated sound characteristic whose frequency characteristic has a relatively flat transition up to a frequency of approximately 4 kHz and gradually decreases in a range of frequencies exceeding 4 kHz. This allows production of an effect of changing a sound by applying a generated sound characteristic while avoiding reproduction of a sound very different from a sound of the real object. After ending the processing in step S1014, the generated sound characteristic acquisition unit 712 ends the processing for acquiring a generated sound characteristic from the generated sound characteristic DB 711, so that the processing returns to the image/sound reproduction processing illustrated in FIG. 9.

By performing the processing illustrated in the flowchart in FIG. 10, the generated sound characteristic acquisition unit 712 can acquire information on a generated sound characteristic most appropriate for the real object located at a display position of the virtual sound source object from the generated sound characteristic DB 711 and output a sound characteristic generated by the vibration. Further, even if the generated sound characteristic DB 711 does not have a generated sound characteristic appropriate for the real object, the change of a sound can be expressed by applying a sound characteristic generated by vibration, while avoiding reproduction of a sound inappropriate for the real object.

In the example illustrated in FIG. 10, the search processing is performed by sequentially selecting a piece of information on a generated sound characteristic from the first piece of the pieces of information on a generated sound characteristic stored in the generated sound characteristic DB 711. However, the present exemplary embodiment is not limited thereto. As long as the search processing can be performed on all of the pieces of information on a sound characteristic generated by vibration stored in the generated sound characteristic DB 711, information about a generated sound characteristic as a target of the search processing may be selected in any order.

According to the present exemplary embodiment, the acquisition of a sound characteristic generated by vibration, which is appropriate for a real object located at a display position of a virtual sound source (virtual object) displayed in a virtual reality manner, and application of the sound characteristic generated by vibration to a sound source signal allows expression of a state where a sound is changed into a sound whose quality is appropriate for the real object. This configuration allows reproduction of a sound which makes the user feel as if the virtual sound source (virtual object) displayed in a virtual-reality manner actually exists in the real world.

Other Exemplary Embodiments

Figure 11:
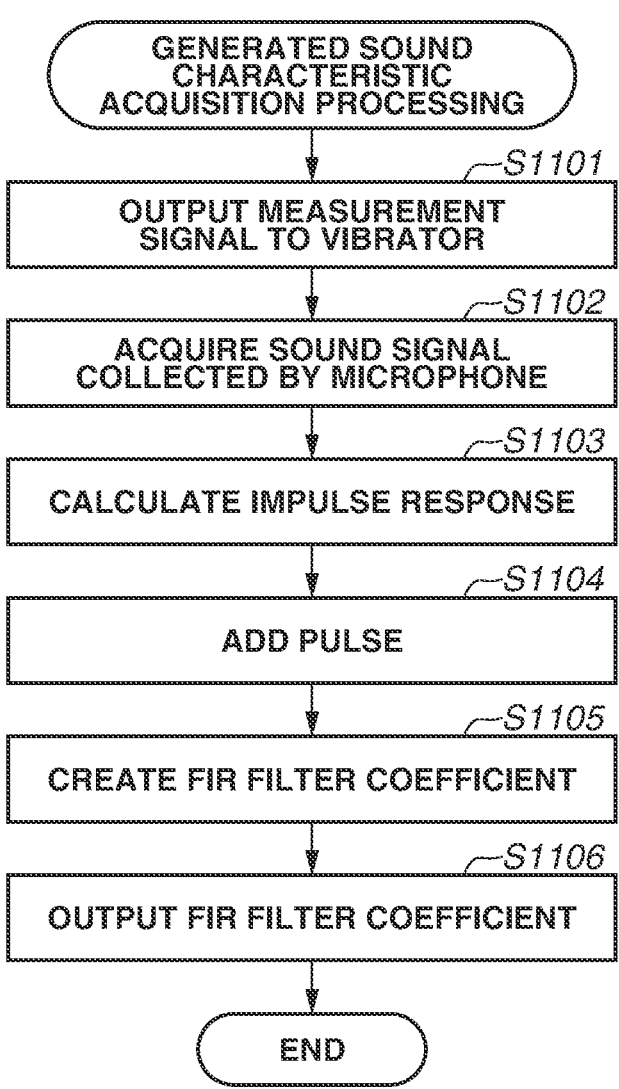
FIG. 11 is a flowchart illustrating an example of the generated sound characteristic acquisition processing.

In the above-described exemplary embodiment, only a sound characteristic generated by vibration is applied to a sound source signal. However, if a sound characteristic generated by vibration has a poor sound quality with a narrow bandwidth as illustrated in FIG. 3B, a reproduced sound is not very good if that generated sound characteristic is applied to the sound source signal as it is. Thus, an original sound source signal may be added as appropriate. For example, through the generated sound characteristic acquisition processing performed in step S502 of FIG. 5, an original sound source signal may be added as illustrated in a flowchart in FIG. 11. FIG. 11 is a flowchart illustrating another example of the generated sound characteristic acquisition processing performed in step S502 of FIG. 5.

The processing in steps S1101 to S1103 is similar to the processing in steps S601 to S603 of FIG. 6, and the descriptions thereof are omitted.

In step S1104, the generated sound characteristic acquisition unit 103 adds a pulse based on the original sound source signal to the impulse response of a sound generated by vibration acquired in step S1103. The above-described processing allows the original sound source signal to be added, and the ratio of the added pulse can also be adjusted by adjusting the amplitude of the pulse.

The processing in steps S1105 and S1106 is similar to the processing in steps S604 and S605 of FIG. 6., and the descriptions thereof are omitted.

Further, in the above-described exemplary embodiment, a sound characteristic generated by vibration is described to be an impulse response. However, a sound characteristic generated by vibration may be another characteristic, such as a frequency characteristic acquired by vibrating a frequency sweep signal.

Further, in the above-described exemplary embodiment, the processing is repeatedly performed on a sound source signal of each processing unit time. However, the processing may be performed, for example, by a musical composition, by preparing a storage unit, such as a large-capacity buffer.

Further, in the above-described exemplary embodiment, a headphone is used as an output destination of the sound. However, the sound may be output to another output device, such as a speaker.

Further, in the above-described exemplary embodiment, if a virtual-reality is to be displayed, another virtual object may be displayed together with an image in the real world in addition to the virtual object (virtual sound source object) serving as a virtual sound source.

Furthermore, in the above-described second exemplary embodiment, the generated sound characteristic acquisition unit 712 calculates scores for all of the pieces of information on a generated sound characteristic stored in the generated sound characteristic DB 711. However, some embodiments of the present disclosure are not limited thereto. For example, the generated sound characteristic acquisition unit 712 may classify the pieces of information on a generated sound characteristic stored in the generated sound characteristic DB 711 into clusters, find out an approximate score for each of the clusters, and perform search processing on pieces of information on a generated sound characteristic included in the most approximate cluster. In this way, the amount of processing for the search processing can be reduced.

Further, in the above-described second exemplary embodiment, the signal processing apparatus may previously set a viewer's moving range and previously extract a real object existing in an image-capturing range of the camera predicted from that moving range. Further, the signal processing apparatus may previously perform search processing on the extracted real object and save a correspondence table of a real object existing in the image capturing range and a search result in the generated sound characteristic DB 711. In this way, the generated sound characteristic acquisition unit 712 can perform processing on a real-time basis without delay by promptly acquiring the sound characteristic generated by vibration with reference to this table.

Further, in the above-described second exemplary embodiment, the display position of a virtual sound source is not limited to a horizontal surface. The signal processing apparatus may also specify an inclined surface as the display position by calculating the inclination angle of the inclined surface and modifying the display position of a virtual sound source object accordingly and appropriately. Alternatively, a vertical surface or a lower side of a top surface may be specified as the display position by rotating a virtual sound source object so that the virtual sound source object stands on the bottom side of the vertical surface or the top surface. In other words, every surface of the real object can be specified as the display position depending on an effect produced in the image.

Further, in the above-described second exemplary embodiment, if a generated sound characteristic appropriate for a real object is not in the generated sound characteristic DB 711, a sound characteristic generated by vibration with a flat characteristic is applied to a sound source signal. However, in this case, a sound characteristic generated by vibration may not necessarily be applied. In this way, although the effect of changing a sound cannot be produced depending on a real object if a generated sound characteristic appropriate for the real object is not in the generated sound characteristic DB 711, the reproduction of a sound very different from the actual sound can be avoided.

Further, in the above-described second exemplary embodiment, a virtual sound source object is rendered based on a 3D model. However, a two-dimensional image captured in a green background or a blue background and cut out from the background or a two-dimensional computer graphic (CG) character can also be used. Further, a sound can also be reproduced by using information on a generated sound characteristic appropriate for or similar to a model for an object by creating the model or a similar model for the object through computer graphics.

Some embodiments of the present disclosure can also be realized through the processing in which a program for carrying out one or more functions according to the above-described exemplary embodiments is supplied to a system or an apparatus via a network or a storage medium, and one or more processors in the system or a computer of the apparatus read and run the program. Further, some embodiments of the present disclosure can also be realized with a circuit (e.g., application specific integrated circuit (ASIC)) for implementing one or more functions.

Furthermore, the above-described exemplary embodiments are merely the examples embodying the present disclosure, and do not have to be construed as limiting the technical range of the present disclosure. In other words, embodiments of the present disclosure can be realized in diverse ways without departing from the technical spirit or main features of the present disclosure.

Embodiment(s) of the present disclosure can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has described exemplary embodiments, it is to be understood that some embodiments of the disclosure are not limited to the disclosed exemplary embodiments. The scope of the following claims is to be accorded the broadest interpretation so as to encompass all such modifications and equivalent structures and functions.

This application claims priority to Japanese Patent Application No. 2023-042230, which was filed on Mar. 16, 2023 and which is hereby incorporated by reference herein in its entirety.

What is claimed is:

1. A signal processing apparatus comprising:

one or more memories storing instructions; and one or more processors executing the instructions to:

acquire a sound characteristic generated by vibration depending on a real-world object with which a virtual object is in contact, in a virtual-reality display in which an image of the virtual object is superimposed and displayed on a real-world image;

apply the acquired sound characteristic generated by vibration to a sound source signal of the virtual object; and reproduce a sound depending on the sound signal to which the sound characteristic generated by vibration is applied.

2. The signal processing apparatus according to claim 1, wherein the one or more processors further execute the instructions to:

decide on a display position where the virtual object is displayed based on the real-world image; and acquire the sound characteristic generated by vibration based on an object existing at a display position of the virtual object.

3. The signal processing apparatus according to claim 2, wherein the one or more processors further execute the instructions to:

analyze the object existing at the display position of the virtual object based on the real-world image; and acquire the sound characteristic generated by vibration based on an analysis result acquired through the analysis.

4. The signal processing apparatus according to claim 1, wherein the one or more processors further execute the instructions to:

store a plurality of sound characteristics generated by vibration of a plurality of objects; and acquire the sound characteristic generated by vibration depending on the real-world object with which the virtual object is in contact, from the plurality of sound characteristics generated by vibration.

5. The signal processing apparatus according to claim 4, wherein the one or more processors further execute the instructions to acquire the sound characteristic generated by vibration depending on the real-world object with which the virtual object is in contact, by searching the plurality of sound characteristics based on an object existing at a display position of the virtual object in the real-world image.

6. The signal processing apparatus according to claim 4, wherein the one or more processors further execute the instructions to:

store the sound characteristic generated by vibration and attribute information of the real-world object; and acquire the sound characteristic generated by vibration having the highest correlation with the attribute information by searching the plurality of sound characteristics based on attribute information of an object existing at a display position of the virtual object in the real-world image.

7. The signal processing apparatus according to claim 1, wherein the one or more processors further execute the instructions to acquire the sound characteristic generated by vibration based on a sound generated by vibrating an object with a vibrator mounted on the object.

8. The signal processing apparatus according to claim 1, wherein the one or more processors further execute the instructions to perform filter processing on a sound source signal of the virtual object by using a finite impulse response (FIR) filter or an infinite impulse response (IIR) filter having a filter coefficient depending on the acquired sound characteristic generated by vibration.

9. The signal processing apparatus according to claim 1, wherein the one or more processors further execute the instructions to:

combine a virtual-object image and the real-world image into one combined image; and reproduce the one combined image.

10. A control method for a signal processing apparatus, the control method comprising:

acquiring a sound characteristic generated by vibration depending on a real-world object with which a virtual object is in contact, in a virtual-reality display in which an image of the virtual object is superimposed and displayed on a real-world image;

applying the acquired sound characteristic generated by vibration to a sound source signal of the virtual object; and reproducing a sound depending on the sound signal to which the sound characteristic generated by vibration is applied.

11. A non-transitory computer-readable storage medium storing a program for causing a signal processing apparatus to execute a control method, the control method comprising:

acquiring a sound characteristic generated by vibration depending on a real-world object with which a virtual object is in contact, in a virtual-reality display in which an image of the virtual object is superimposed and displayed on a real-world image;

applying the acquired sound characteristic generated by vibration to a sound source signal of the virtual object; and reproducing a sound depending on the sound signal to which the sound characteristic generated by vibration is applied.

* * * * *